(12) United States Patent
Akita et al.

(10) Patent No.: US 7,968,864 B2
(45) Date of Patent: Jun. 28, 2011

(54) GROUP-III NITRIDE LIGHT-EMITTING DEVICE

(75) Inventors: Katsushi Akita, Itami (JP); Hitoshi Kasai, Itami (JP); Takashi Kyono, Itami (JP); Kensaku Motoki, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 211 days.

(21) Appl. No.: 12/390,036

(22) Filed: Feb. 20, 2009

(65) Prior Publication Data
US 2009/0212277 A1    Aug. 27, 2009

(30) Foreign Application Priority Data
Feb. 22, 2008    (JP) .................................. 2008-041745

(51) Int. Cl.
  *H01L 29/74* (2006.01)
  *H01L 31/111* (2006.01)
(52) U.S. Cl. ................ 257/11; 257/79; 438/47
(58) Field of Classification Search .............. 257/13, 257/79, E21.09, E33.02; 438/47
See application file for complete search history.

(56) References Cited

U.S. PATENT DOCUMENTS

| | | | | |
|---|---|---|---|---|
| 5,550,393 A * | 8/1996 | Nishimura | ..................... | 257/192 |
| 5,606,176 A * | 2/1997 | Nitta | ..................... | 257/18 |
| 6,670,647 B1 * | 12/2003 | Yamasaki et al. | ............... | 257/99 |
| 6,835,963 B2 * | 12/2004 | Hatakoshi et al. | ............... | 257/98 |
| 6,900,465 B2 * | 5/2005 | Nakamura et al. | ............. | 257/79 |
| 6,977,953 B2 * | 12/2005 | Hata et al. | .................. | 372/46.01 |
| 7,858,996 B2 * | 12/2010 | Zhong et al. | ..................... | 257/98 |
| 2007/0093073 A1 * | 4/2007 | Farrell et al. | .................. | 438/763 |
| 2008/0006831 A1 | 1/2008 | Ng | | |
| 2008/0023708 A1 | 1/2008 | Akita et al. | | |

FOREIGN PATENT DOCUMENTS

| | | |
|---|---|---|
| JP | 10-135576 | 5/1998 |
| JP | 10-303459 | 11/1998 |
| JP | 2001-291703 | 10/2001 |
| JP | 2003-158297 | 5/2003 |
| JP | 2005-097045 | 4/2005 |

(Continued)

OTHER PUBLICATIONS

M. Funato et al., "Blue, Green, and Amber InGaN/GaN Light-Emitting Diodes on Semipolar {1122} GaN Bulk Substrates," Japanese Journal of Applied Physics, 45:26, 2006, pp. L659-L662.

(Continued)

*Primary Examiner* — Phuc T Dang
(74) *Attorney, Agent, or Firm* — Venable LLP; Michael A. Sartori; Kyle D. Petaja

(57) ABSTRACT

A group-III nitride light-emitting device is provided. An active layer having a quantum well structure is grown on a basal plane of a gallium nitride based semiconductor region. The quantum well structure is formed in such a way as to have an emission peak wavelength of 410 nm or more. The thickness of a well layer is 4 nm or more, and 10 nm or less. The well layer is composed of $In_XGa_{1-X}N$ ($0.15 \leq X < 1$, where X is a strained composition). The basal plane of the gallium nitride based semiconductor region is inclined at an inclination angle within the range of 15 degrees or more, and 85 degrees or less with reference to a {0001} plane or a {000-1} plane of a hexagonal system group III nitride. The basal plane in this range is a semipolar plane.

11 Claims, 8 Drawing Sheets

FOREIGN PATENT DOCUMENTS

| | | |
|---|---|---|
| JP | 2007-134507 | 5/2007 |
| JP | 2007-311619 | 11/2007 |
| JP | 2007-537600 | 12/2007 |
| JP | 2008-010835 | 1/2008 |
| JP | 2009-071127 | 4/2009 |
| WO | WO-2005/112123 A2 | 11/2005 |
| WO | WO-2006/130696 A2 | 12/2006 |

OTHER PUBLICATIONS

A. Tyagi et al., "Semipolar (1011) InGaN/GaN Laser Diodes on Bulk GaN Substrates," Japanese Journal of Applied Physics, 46:19, 2007, pp. L444-L445.

A. Chakraborty et al., "Milliwatt Power Blue InGaN/GaN Light-Emitting Diodes on Semipolar GaN Templates," Japanese Journal of Applied Physics, 44:30, 2005, pp. L945-L947.

R. Sharma et al., "Demonstration of a semipolar (1013) InGaN/GaN green light emitting diode," Applied Physics Letters, 87:231110, 2005, pp. 231110-1-231110-3.

A. Tyagi et al., "High Brightness Violet InGaN/GaN Light Emitting Diodes on Semipolar (1011) Bulk GaN Substrates," Japanese Journal of Applied Physics 46:7, 2007, pp. L129-L131.

Zhong Hong et al: "High power and high efficiency blue light emitting diode on freestanding semipolar (1011) bulk GaN Substrate," Applied Physics Letters, vol. 90, No. 23, (2007), 233504.

Hirai A. et al: "Formation and reduction of pyramidal hillocks on m-plane (1100) GaN," Applied Physics Letters, vol. 91, No. 19 (2007), 191906.

\* cited by examiner

GROUP-III NITRIDE LIGHT-EMITTING DEVICE

BACKGROUND OF THE INVENTION

1. Field of the Invention

The present invention relates to a group-III nitride light-emitting device and a method for manufacturing a group-III nitride based semiconductor light-emitting device.

2. Description of the Related Art

Japanese Journal of Applied Physics Vol. 45, No. 26, 2006, pp. L659-L662 (Non-Patent Document 1) describes InGaN light-emitting diodes. These light-emitting diodes were produced on a semipolar (11-22) plane (58 degrees off the c-plane in an a-axis direction) GaN substrates. The light-emitting diodes had single quantum well structures composed of an InGaN well layers having a width of 3 nm. The following characteristics were attained. Regarding blue emission (wavelength 430 nm), the optical output was 1.76 mW, and the external quantum efficiency was 3.0%. Regarding green emission (wavelength 530 nm), the optical output was 1.91 mW, and the external quantum efficiency was 4.1%. Regarding amber emission (wavelength 580 nm), the optical output was 0.54 mW, and the external quantum efficiency was 1.3%. It was ascertained that the emission light was polarized in the [1-100] direction.

Japanese Journal of Applied Physics Vol. 46, No. 19, 2007, pp. L444-L445 (Non-Patent Document 2) describes a laser diode. The laser diode was produced on a semipolar (10-1-1) plane (62 degrees off the {000-1} plane in a m-axis direction) GaN substrate having a dislocation density of $5 \times 10^6$ cm$^{-2}$ or less. The laser diode has an active layer having a 5-period multi-quantum well structure composed of 5-nm InGaN well layers and 8-nm GaN barrier layers. The emission wavelength was 405.9 nm, and lasing was ascertained at a threshold current density of 18 kA/cm$^2$.

Japanese Journal of Applied Physics Vol. 44, No. 30, 2005, pp. L945-L947 (Non-Patent Document 3) describes light-emitting diodes having a 5-period multi-quantum well structures. These light-emitting diodes were produced on a semi-polar (10-1-1) plane GaN template and a semipolar (10-1-3) plane GaN template. The semipolar (10-1-1) plane is inclined from a {000-1} plane at an angle of 62 degrees in the m-axis direction, and the semipolar (10-1-3) plane is inclined from a {000-1} plane at an angle of 32 degrees in the m-axis direction. In the 5-period multi-quantum well structure, the thickness of the InGaN well layer is 4 nm, and the composition of indium is 0.14. The thickness of a Si-doped GaN barrier layer is 15 nm. The emission wavelength of the light-emitting diode on the semipolar (10-1-1) plane GaN template was 439 nm. The on-wafer optical output was 0.19 mW at a current of 20 mA, and the external quantum efficiency was 0.41% at a current of 50 mA.

Applied Physics Letter Vol. 87, 2005, p. 231110 (Non-Patent Document 4) describes a light-emitting diode having a 5-period multi-quantum well structure. This light-emitting diode was produced on a semipolar (10-1-3) plane GaN template. The laser diode includes an InGaN well layer having a thickness of 4 nm and a GaN barrier layer having a thickness of 8 nm. The emission wavelength was 527.1 nm at a current of 20 mA and 520.4 nm at a current of 250 mA. The on-wafer optical output was 0.264 mW at a current of 20 mA, and the external quantum efficiency was 0.052% at a current of 20 mA.

Japanese Unexamined Patent Application Publication No. 10-135576 (Patent Document 1) describes a method for manufacturing a light-emitting semiconductor device including a group-III nitride quantum well layer formed on a non-conductive substrate. This group-III nitride quantum well layer is grown in such a way as to have a facet orientation inclined at an angle of 10 degrees or more with reference to the {0001} direction of a wurtzite crystal structure. The inclination angle can be within the range of 30 degrees to 50 degrees, within the range of 80 degrees to 100 degrees, and within the range of 130 degrees to 150 degrees.

Japanese Unexamined Patent Application Publication No. 2003-158297 (Patent Document 2) describes a semiconductor light-emitting device formed on a substrate. The semiconductor light-emitting device is formed on a {1-100} plane and a plane inclined from this plane at an off-angle within the range of −5 degrees to +5 degrees or a {11-20} plane and a plane inclined from this plane at an off-angle within the range of −5 degrees to +5 degrees.

In Non-Patent Documents 3 and 4, the GaN templates are used. In Non-Patent Documents 1 and 2 and Japanese Journal of Applied Physics Vol. 46, No. 7, 2007, pp. L129-L131 (Non-Patent Document 5), the GaN substrates are used. In Non-Patent Documents other than Non-Patent Document 3, the indium composition of the well layer is not described. Regarding Patent Document 1, a plane inclined in the a-axis direction is used, and regarding Non-Patent Documents 2 to 5, planes inclined in the m-axis direction are used. The light-emitting devices described in Non-Patent Documents 1, 2, and 5 include small-sized GaN substrates and, therefore, use of a large-diameter GaN wafer is not directed.

In Patent Document 1, attention is given to merely an effect of piezoelectric polarization, and no attention is given to the relationship between reduction in piezoelectric polarization and desired wavelength and light emission characteristics. In Patent Document 2, a desired emission wavelength is not achieved.

Since the piezoelectric polarization of the semipolar plane is smaller than the piezoelectric polarization of the (0001) plane, an increase in wavelength due to band bending of the well layer cannot be expected. Therefore, regarding the light-emitting devices including thin well layers as described in Non-Patent Documents 1 and 5, it is necessary to increase the indium composition in order to form a light-emitting device having a long emission wavelength of, for example, 410 nm or more. However, the crystal quality of the well layer having a high indium composition is degraded. As a result, the emission characteristics deteriorate. In the case where the indium composition of the well layer is relatively high, the strain included in the well layer increases as the thickness of the well layer increases. Consequently, the relationship between the thickness of the well layer and the indium composition exerts a significant influence on the emission characteristics of the active layer having the quantum well structure.

SUMMARY OF THE INVENTION

It is an object of the present invention to provide a group-III nitride light-emitting device including an active layer which has an emission peak wavelength of 410 nm or more, which is grown on a semipolar plane, and which has a quantum well structure. It is another object of the present invention to provide a method for manufacturing the above-described group-III nitride based semiconductor light-emitting device.

A group-III nitride light-emitting device according to an embodiment of the present invention includes (a) a group-III nitride substrate having a basal plane, (b) a gallium nitride based semiconductor region grown on the above-described basal plane of the above-described group-III nitride substrate, and (c) an active layer grown on a basal plane of the above-described gallium nitride based semiconductor region in such a way as to have an emission peak wavelength of 410 nm or more. The above-described active layer includes well layers and barrier layers, and they are arranged alternately so as to form a quantum well structure. The thickness of the above-described well layer is 4 nm or more, and 10 nm or less. The above-described well layer is composed of $In_XGa_{1-X}N$ ($0.15 \leq X < 1$, where X is a strained composition), and the above-described barrier layer is composed of $In_YGa_{1-Y}N$ ($0 \leq Y \leq 0.05$, $Y < X$, where Y is a strained composition). The basal plane of the above-described gallium nitride based semiconductor region is a semipolar plane inclined at an inclination angle within the range of 15 degrees or more, and 85 degrees or less with reference to a $\{0001\}$ plane or a $\{000\text{-}1\}$ plane.

If the above-described inclination angle is less than 15 degrees, an effect of the semipolar plane is not obtained and, therefore, a piezoelectric field is not reduced. Consequently, an effect of improving the quantum efficiency is not obtained, and a blue shift of wavelength along with current injection becomes significant. If the inclination angle exceeds 85 degrees, growth of the InGaN well layer becomes difficult.

Since the piezoelectric field is suppressed with respect to the semipolar plane, an increase in wavelength due to band bending of the quantum well active layer cannot be expected. Hence, the indium composition of a well layer having a thickness of less than 4 nm becomes very high in order to obtain an emission wavelength of 410 nm or more. As a result, the crystal quality of the InGaN well layer is degraded, and the emission characteristics deteriorate. If the thickness of the InGaN well layer exceeds 10 nm, the crystal quality is degraded and the emission characteristics deteriorate. In the case where the thickness of the well layer is specified to be within the range of 4 nm or more, and 10 nm or less, the indium composition of the well layer can be controlled within the range of 0.15 or more, and 0.4 or less.

The film thickness of the well layer of the active layer formed on the semipolar plane inclined at the above-described inclination angle is 4 nm or more, and 10 nm or less and, therefore, is larger than the thickness of the well layer of the active layer formed on a c-plane. In this case, the piezoelectric field is reduced and, thereby, a significant blue shift of wavelength and a reduction in quantum efficiency along with an increase in current are reduced.

In the group-III nitride light-emitting device according to an embodiment of the present invention, preferably, the basal plane of the above-described gallium nitride based semiconductor region is inclined at an angle within the range of 15 degrees or more, and 45 degrees or less with reference to the $\{0001\}$ plane or the $\{000\text{-}1\}$ plane.

In the case where the above-described inclination angle is 45 degrees or less, a large-diameter group-III nitride wafer is produced easily. Furthermore, in the case where the basal plane is inclined at an inclination angle within the above-described range, the InGaN well layer grows relatively easily.

In the group-III nitride light-emitting device according to an embodiment of the present invention, preferably, the basal plane of the above-described gallium nitride based semiconductor region is inclined at an angle within the range of 15 degrees or more, and 45 degrees or less with reference to the $\{0001\}$ plane or the $\{000\text{-}1\}$ plane, and the indium composition X of the above-described well layer is less than 0.4.

According to this embodiment, in the case where the basal plane is inclined at an inclination angle within this range, the InGaN well layer grows relatively easily. Furthermore, if the indium composition exceeds 0.4, the crystal quality of the InGaN well layer is degraded, and the emission characteristics deteriorate.

In the group-III nitride light-emitting device according to an embodiment of the present invention, preferably, the above-described active layer including the above-described quantum well structure is grown on the above-described basal plane in such a way as to have an emission peak wavelength of 550 nm or less.

Regarding a nitride based semiconductor light-emitting device which emits light with a wavelength of 410 nm or more, and 550 nm or less, in general, a strain is applied to an InGaN well layer and a piezoelectric field is induced so as to cause a reduction in quantum efficiency and an increase in blue shift of emission wavelength. According to the group-III nitride light-emitting device of an embodiment of the present invention, in the above-described range of emission wavelength, the crystal quality of InGaN is improved, deterioration of the emission characteristics can be reduced and, in addition, a significant blue shift can be reduced.

A group-III nitride light-emitting device according to another embodiment of the present invention may further includes a p-type gallium nitride based semiconductor region grown on the above-described active layer and the second electrode disposed on the above-described p-type gallium nitride based semiconductor region. The above-described gallium nitride based semiconductor region grown on the above-described basal plane of the above-described group-III nitride substrate has n-conductivity. The basal plane of the above-described group-III nitride substrate is inclined at an inclination angle within the range of 15 degrees or more, and 85 degrees or less with reference to the $\{0001\}$ plane or the $\{000\text{-}1\}$ plane. The above-described gallium nitride based semiconductor region, the above-described active layer, and the above-described p-type gallium nitride based semiconductor region are located on the above-described basal plane of the above-described group-III nitride substrate in that order from the above-described substrate. The above-described group-III nitride substrate is composed of $In_SAl_TGa_{1-S-T}N$ ($0 \leq S \leq 1$, $0 \leq T \leq 1$, and $0 \leq S+T \leq 1$).

According to this group-III nitride light-emitting device, the light-emitting device can be produced on the group-III nitride substrate having the inclined basal plane without using a template.

The group-III nitride light-emitting device according to an embodiment of the present invention may further include the first electrode disposed on a back surface of the above-described group-III nitride substrate. Preferably, the above-described group-III nitride substrate has n-conductivity.

According to this group-III nitride light-emitting device, since the group-III nitride substrate has the conductivity, the electrode can be formed on the back surface of the substrate. Consequently, forming both p-type and n-type electrodes on an epitaxial layer grown on the basal plane of the group-III nitride substrate becomes unnecessary, and the structure of the group-III nitride light-emitting device can be simplified.

In the group-III nitride light-emitting device according to an embodiment of the present invention, the above-described inclination angle may be specified in an a-axis direction of $In_SAl_TGa_{1-S-T}N$ of the above-described group-III nitride substrate, and the off-angle of the above-described inclination angle may be within the range of −1 degree or more, and +1 degree or less with reference to an m-axis.

According to this group-III nitride light-emitting device, since the basal plane of the group-III nitride substrate composed of $In_SAl_TGa_{1-S-T}N$ is inclined from the $\{0001\}$ plane in the a-axis direction, incorporation of indium atoms into the InGaN well layer increases as compared with that in the case of inclination in the m-axis direction. Hence, the InGaN well layer can be grown at a higher growth temperature. As a result, the emission characteristics can be improved.

The group-III nitride light-emitting device according to an embodiment of the present invention may further includes first and second facets which intersect the m-axis direction of $In_SAl_TGa_{1-S-T}N$ of the above-described group-III nitride substrate. The above-described group-III nitride light-emitting device includes a laser diode, and the above-described first and second facets include cleavage planes.

According to this group-III nitride light-emitting device, a resonator plane for a laser diode is formed through cleavage of the substrate composed of $In_SAl_TGa_{1-S-T}N$. This resonator plane is an m-plane.

In the group-III nitride light-emitting device according to an embodiment of the present invention, the above-described inclination angle may be specified in an m-axis direction of $In_SAl_TGa_{1-S-T}N$ of the above-described group-III nitride substrate, and the off-angle of the above-described inclination angle may be within the range of −1 degree or more, and +1 degree or less with reference to an a-axis.

According to this group-III nitride light-emitting device, control and adjustment of the direction in which the inclination angle is specified becomes easy.

Preferably, the group-III nitride light-emitting device according to an embodiment of the present invention further includes an $In_ZGa_{1-Z}N$ (0<Z<0.1, where Z is a strained composition) layer between the above-described active layer and the above-described group-III nitride substrate. According to this embodiment, the $In_ZGa_{1-Z}N$ layer is disposed between the layer having the quantum well structure and the group-III nitride wafer and, thereby, good emission characteristics can be obtained even when the number of well layers constituting the quantum well structure is reduced. It is also possible to increase the number of well layers in the quantum well structure in order to improve the emission characteristics. However, since the indium composition of the well layer of the active layer produced on the semipolar plane is higher than that of the active layer produced on a c-plane, strain in the active layer increases and the crystal quality of the InGaN well layer is degraded. If the indium composition of the $In_ZGa_{1-Z}N$ layer becomes 0.1 or more, the strain of the $In_ZGa_{1-Z}N$ layer increases, the crystal quality of the InGaN well layer is degraded, and the emission characteristics deteriorate.

In the group-III nitride light-emitting device according to an embodiment of the present invention, preferably, threading dislocations in the above-described group-III nitride substrate extend along a c-axis, the above-described group-III nitride substrate includes a first region having a threading dislocation density higher than or equal to a predetermined threading dislocation density and a second region having a threading dislocation density lower than the above-described predetermined threading dislocation density, and the above-described first and second regions of the group-III nitride substrate appear in the above-described basal plane.

According to this group-III nitride light-emitting device, the quantum efficiency and the reliability of the light-emitting device can be improved by producing the nitride based semiconductor light-emitting device in the second region which is a low-dislocation region of the substrate.

In the group-III nitride light-emitting device according to an embodiment of the present invention, the threading dislocation density of the above-described second region may be less than $1 \times 10^7$ cm$^{-2}$. According to this threading dislocation density of the group-III nitride light-emitting device, a laser diode exhibiting practically sufficient reliability is obtained.

Another embodiment of the present invention relate to a method for manufacturing a nitride based semiconductor light-emitting device. This method includes the steps of (a) preparing a group-III nitride wafer having a basal plane inclined at an inclination angle within the range of 15 degrees or more, and 45 degrees or less with reference to a {0001} plane or a {000-1} plane, (b) forming a first conductive type of gallium nitride based semiconductor region on the above-described basal plane of the above-described group-III nitride wafer, (c) forming an active layer having a quantum well structure on a basal plane of the first conductive type of gallium nitride based semiconductor region in such a way as to have an emission peak wavelength of 410 nm or more, and (d) forming a second conductive type of gallium nitride based semiconductor region on the above-described active layer. The above-described group-III nitride wafer is composed of $In_SAl_TGa_{1-S-T}N$ (0≦S≦1, 0≦T≦1, and 0≦S+T≦1), and the above-described formation of the above-described active layer includes a step in which a first semiconductor layer composed of $In_XGa_{1-X}N$ (0.15≦X<1, where X is a strained composition) is grown at a first temperature and a step in which a second semiconductor layer composed of $In_YGa_{1-Y}N$ (0≦Y≦0.05, Y<X, where Y is a strained composition) is grown at a second temperature. The above-described first temperature is lower than the above-described second temperature, and the difference between the above-described first temperature and the above-described second temperature is 95 degree or more in Celsius.

Regarding this method, in the production of the nitride based semiconductor light-emitting device on the semipolar plane, the growth temperature of the InGaN well layer is made lower than the growth temperature of the barrier layer in such a way that the difference becomes 95 degree or more in Celsius and, thereby, incorporation of indium atoms into the well layer can increase. Consequently, an active layer having an emission peak wavelength of 410 nm or more can be formed easily. Furthermore, the growth temperature of the barrier layer is made higher than the growth temperature of the well layer in such a way that the difference becomes 95 degree or more in Celsius and, thereby, the crystal quality of the barrier layer can be improved. Hence, the quantum efficiency of the light-emitting device can be improved. Therefore, the crystal quality of the whole quantum well structure can be improved.

In the method according to an embodiment of the present invention, the above-described group-III nitride wafer may be produced by slicing a crystal of hexagonal system $In_SAl_TGa_{1-S-T}N$ (0≦S≦1, 0≦T≦1, and 0≦S+T≦1) grown in a direction of an axis inclined at an inclination angle within the range of 15 degrees or more, and 45 degrees or less with reference to the {0001} plane or the {000-1} plane, and the above-described basal plane of the above-described group-III nitride wafer may be subjected to a polishing treatment and be extended along a reference plane inclined at an inclination angle within the range of 15 degrees or more, and 45 degrees or less with reference to the {0001} plane or the {000-1} plane. According to this method, the group-III nitride wafer having a basal plane inclined at the inclination angle is produced easily.

In the method according to an embodiment of the present invention, preferably, threading dislocations in the above-described group-III nitride wafer extend along a c-axis, the above-described group-III nitride wafer includes the first region having a threading dislocation density higher than or equal to a predetermined threading dislocation density and the second region having a threading dislocation density lower than the above-described predetermined threading dislocation density, and the above-described first and second regions of the above-described group-III nitride wafer appear at the above-described basal plane. According to this method, the quantum efficiency and the reliability of the light-emitting device can be improved by producing the nitride based semiconductor light-emitting device in the second region which is a low-dislocation region of the substrate.

In the method according to an embodiment of the present invention, the above-described threading dislocation density of the above-described second region may be less than $1\times10^7$ $cm^{-2}$. According to this threading dislocation density, light-emitting devices, e.g., laser diodes and a light-emitting diodes, exhibiting practically sufficient reliability are obtained.

In the method according to an embodiment of the present invention, preferably, the above-described inclination angle is specified in an a-axis direction of $In_S Al_T Ga_{1-S-T} N$ of the above-described substrate, and the off-angle of the above-described inclination angle is within the range of −1 degree or more, and +1 degree or less with reference to an m-axis. According to this method, a resonator plane for a laser diode can be formed through a step of cleaving the substrate composed of $In_S Al_T Ga_{1-S-T} N$. This resonator plane is an m-plane.

In the method according to an embodiment of the present invention, the above-described inclination angle may be specified in an m-axis direction of $In_S Al_T Ga_{1-S-T} N$ of the above-described substrate, and the off-angle of the above-described inclination angle may be within the range of −1 degree or more, and +1 degree or less with reference to an a-axis. According to this method, control of the direction in which the inclination angle is specified becomes easy.

In the method according to an embodiment of the present invention, a maximum value of the distance between 2 points on the edge of the above-described group-III nitride wafer may be 45 mm or more. According to this method, the light-emitting device can be produced on a large-diameter wafer having the semipolar plane.

The method according to an embodiment of the present invention may further include the step of heat-treating the above-described basal plane of the above-described group-III nitride wafer prior to formation of the above-described first conductive type of gallium nitride based semiconductor region while a gas containing ammonia and hydrogen is supplied.

According to this method, a flat semipolar plane can be obtained by heat-treating the group-III nitride wafer in a mixed gas containing ammonia and hydrogen prior to formation. Consequently, a semiconductor light-emitting device having still better emission characteristics can be obtained.

The above-described objects, features, and advantages of the present invention will be described later in detail with reference to the attached drawings.

The nitride based semiconductor light-emitting device according to the present invention is formed on the semipolar plane and includes the active layer having the quantum well structure. An emission peak wavelength of 410 nm or more can be provided by this active layer. Furthermore, according to the present invention, a method for manufacturing this nitride based semiconductor light-emitting device is provided.

DESCRIPTION OF THE PREFERRED EMBODIMENTS

Figure 1A:
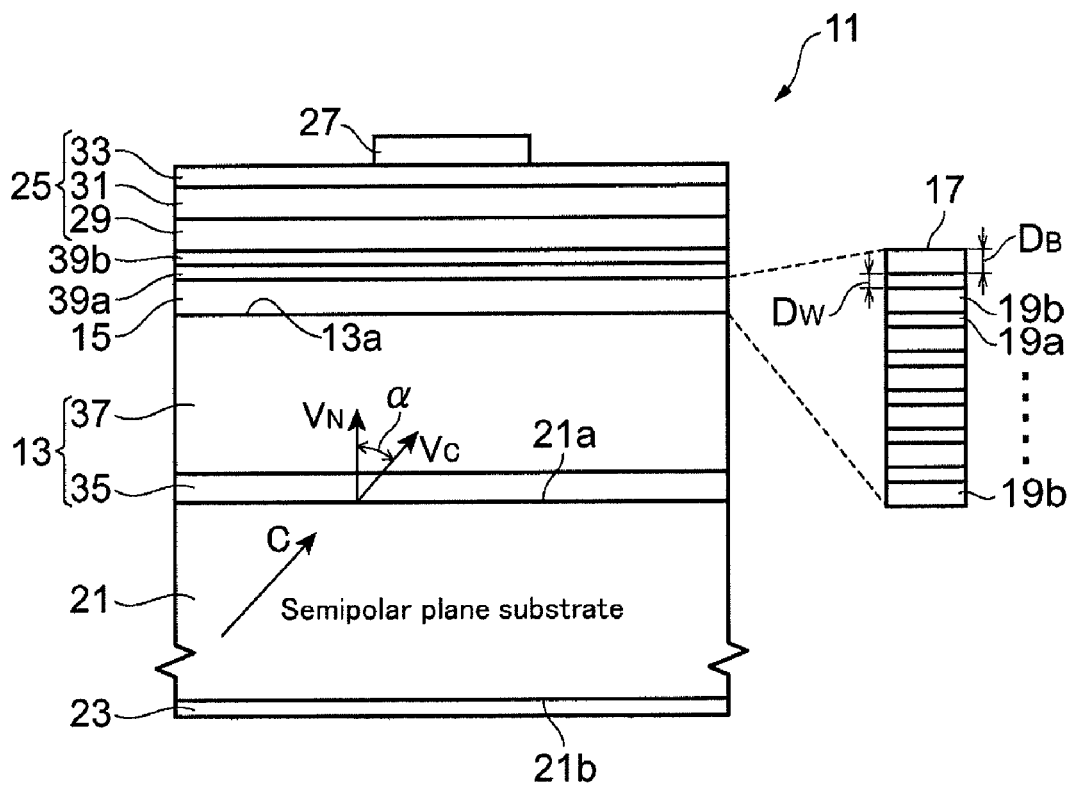
FIG. 1A is a diagram schematically showing an example of the structure of a group-III nitride light-emitting device according to an embodiment.

A group-III nitride light-emitting device and a method for manufacturing a nitride based semiconductor light-emitting device of the present invention will be described below with reference to the attached drawings. In the drawings, the same elements are indicated by the same reference numerals where possible.

FIG. 1 is a diagram schematically showing an example of a group-III nitride light-emitting device according to an embodiment. Examples of group-III nitride light-emitting devices include a laser diode and a light-emitting diode (LED).

As shown in FIG. 1A, a group-III nitride light-emitting device 11 includes a gallium nitride based semiconductor region 13 and an active layer 15. The active layer 15 is grown on a basal plane 13a of the gallium nitride based semiconductor region 13. The active layer 15 has, for example, a quantum well structure 17, and the quantum well structure 17 includes well layers 19a and barrier layers 19b arranged alternately. The quantum well structure 17 is formed in such a way as to provide an emission peak wavelength of 410 nm or more. The thickness $D_w$ of the well layer 19a is 4 nm or more. Furthermore, the thickness $D_w$ of the well layer 19a is 10 nm or less. The well layer 19a is composed of $In_X Ga_{1-X} N$ ($0.15 \leq X$, where X is a strained composition). The basal plane 13a of the gallium nitride based semiconductor region 13 is inclined at an inclination angle of 15 degrees or more with reference to a {0001} plane or a {000-1} plane of hexagonal system group III nitride. Furthermore, the basal plane 13a of the gallium nitride based semiconductor region 13 is inclined at an inclination angle α of 85 degrees or less with reference to the {0001} plane or the {000-1} plane. The basal plane 13a is a semipolar plane with an angle within the above-described range. Moreover, the basal plane of the active layer 15 is a semipolar plane. The basal planes of the well layer 19a and the barrier layer 19b are also semipolar planes. The whole basal plane 13a is the semipolar plane. FIG. 1A further shows a vector extending along c-axis (Vc), and a normal vector to the basal plane (Vn). The basal plane 13a of the gallium nitride based semiconductor region 13 is parallel to the basal plane 21a of the group-III nitride substrate 21.

Here, the basal plane refers to a plane substantially perpendicular to a growth direction of the semiconductor layers.

Regarding this group-III nitride light-emitting device 11, if the inclination angle is less than 15 degrees, an effect of the semipolar plane is not obtained, so that the piezoelectric field is not reduced. Consequently, an effect of improving the quantum efficiency is not obtained, and the blue shift of wavelength along with current injection becomes significant. If the inclination angle exceeds 85 degrees, growth of the InGaN well layer 19a becomes difficult.

Since the piezoelectric field is suppressed with respect to the semipolar plane, an increase in wavelength due to band bending of the active layer having the quantum well structure cannot be expected. Regarding a well layer having a thickness of less than 4 nm, the indium composition in the well layer becomes very high in order to obtain an emission wavelength of 410 nm. As a result, the crystal quality of the InGaN well layer is degraded, and the emission characteristics deteriorate. If the thickness of the InGaN well layer exceeds 10 nm, the crystal quality is degraded and the emission characteristics deteriorate. In the case where the thickness of the well layer is specified to be within the range of 4 nm or more, and 10 nm or less, the indium composition of the well layer can be controlled within the range of 0.15 or more, and 0.4 or less.

The film thickness of the well layer of the light-emitting device formed on the semipolar plane inclined at the above-described inclination angle is 4 nm or more, and 10 nm or less. This film thickness is larger than the thickness of the well layer of the light-emitting device formed on a c-plane. Consequently, a significant blue shift of wavelength and a reduction in quantum efficiency along with an increase in current are reduced because of reduction in piezoelectric field.

The barrier layer 19b is composed of $In_YGa_{1-Y}N$ ($0 \leq Y \leq 0.05$, $Y<X$, where Y is a strained composition). The barrier layer 19b may be composed of GaN or InGaN. On the other hand, the well layer 19a is composed of InGaN. Preferably, the thickness $D_B$ of the barrier layer 19b is 7 nm or more. This is because the barrier layer having this thickness can confine carriers favorably. Furthermore, preferably, the thickness $D_B$ of the barrier layer 19b is 20 nm or less. This is because the barrier layer having this thickness can prevent an increase in driving voltage and prevent degradation of the crystal quality of the active layer along with an increase in thickness.

Moreover, preferably, the thickness of the well layer 19a is 5 nm or more. This is because the indium composition of the well layer can be made 0.35 or less and, in addition, still better crystal quality is obtained.

Preferably, the basal plane 13a of the gallium nitride based semiconductor region 13 is inclined at an angle within the range of 45 degrees or less with reference to the {0001} plane or the {000-1} plane. In the case where the inclination angle α is 45 degrees or less, a large-diameter group-III nitride wafer is produced easily. In the case where the inclination angle of the basal plane is within the above-described range, crystal growth of the InGaN well layer becomes relatively easy. Furthermore, preferably, the indium composition X of the well layer 19a grown on this basal plane 13a is 0.4 or less. In the case where the inclination angle of the basal plane is within the above-described range, crystal growth of the InGaN well layer becomes relatively easy. If the indium composition exceeds 0.4, the crystal quality of the InGaN well layer is degraded, and the emission characteristics deteriorate. Moreover, the active layer 15 (quantum well structure 17) may be grown on the basal plane 13a in such a way that an emission peak wavelength of 550 nm or less can be provided.

Regarding the nitride based semiconductor light-emitting device 11 which emits light with a wavelength of 410 nm or more, and 550 nm or less, in general, a strain is applied to the InGaN well layer and a piezoelectric field is induced so as to cause a reduction in quantum efficiency and an increase in blue shift of emission wavelength. According to the group-III nitride light-emitting device 11 of an embodiment of the present invention, in the above-described range of emission wavelength, degradation of the crystal quality of InGaN is suppressed, deterioration of the emission characteristics can be suppressed and, in addition, an occurrence of significant blue shift can be suppressed.

The basal plane 21a of the group-III nitride substrate 21 may be inclined at an inclination angle within the range of 15 degrees or more, and 85 degrees or less with reference to the {0001} plane or the {000-1} plane. Consequently, the light-emitting device can be produced on the group-III nitride substrate having the inclined basal plane without using a template.

The gallium nitride based semiconductor region 13 may be grown on the basal plane 21a of the group-III nitride substrate 21. The group-III nitride substrate 21 may be composed of $In_SAl_TGa_{1-S-T}N$ ($0 \leq S \leq 1$, $0 \leq T \leq 1$, and $0 \leq S+T \leq 1$). The material for the group-III nitride substrate 21 may be composed of gallium nitride based semiconductor, AlN, or the like. The above-described gallium nitride based semiconductor may be, for example, GaN, AlGaN, InGaN, or the like. The substrate for the group-III nitride light-emitting device 11 is not limited to the group-III nitrides of the group-III nitride substrate 21, and may be composed of sapphire, gallium oxide, or the like.

The gallium nitride based semiconductor region 13 has, for example, a first conduction type (for example, n-type conductivity). The group-III nitride light-emitting device 11 may further include a gallium nitride based semiconductor region 25. This gallium nitride based semiconductor region 25 is grown above the active layer 15. The surface of the gallium nitride based semiconductor region 25 is a semipolar plane. The gallium nitride based semiconductor region 25 has, for example, a second conduction type (for example, p-type-conductivity). A second electrode 27 is grown in the gallium nitride based semiconductor region 25.

In one example, the group-III nitride substrate 21 may have n-type conductivity. The whole back surface 21b of the group-III nitride substrate 21 may be a semipolar plane, and an electrode 23 may be disposed on the back surface 21b. Consequently, forming both p-type and n-type electrodes on an epitaxial layer grown on the basal plane 21a of the group-III nitride substrate 21 becomes unnecessary. Furthermore, the structure of the group-III nitride light-emitting device 11 can be simplified. The first electrode 23 is a cathode in ohmic contact with, for example, the back surface 21b of the substrate 21 and covers all over the back surface 21b of the substrate 21. Furthermore, the second electrode 27 is an anode in ohmic contact with, for example, the gallium nitride based semiconductor region 25.

A buffer layer 35 grown all over the basal plane 21a of the group-III nitride substrate 21 may be included. In one example, it is preferable that the buffer layer 35 is composed of AlGaN. This is because abnormal growth of the epitaxial layer on the GaN substrate can be suppressed. Furthermore, the gallium nitride based semiconductor region 13 may include a n-conductive gallium nitride based semiconductor layer 37 (for example, n-type cladding layer) which provides a hetero-barrier to the active layer 15. In one example, preferably, the gallium nitride based semiconductor layer 37 is composed of, for example, n-type GaN or n-type AlGaN.

The gallium nitride based semiconductor region 25 may include an electron blocking layer 29 for blocking electrons from the active layer 15. The electron blocking layer 29 may be composed of, for example, AlGaN. This AlGaN may has, for example, p-type conductivity. Furthermore, the gallium nitride based semiconductor region 25 may include a gallium nitride based semiconductor layer 31 (for example, p-type cladding layer) which provides p-type carriers to the active layer 15. The gallium nitride based semiconductor layer 31 may be composed of, for example, p-type GaN or p-type AlGaN. Moreover, gallium nitride based semiconductor region 25 may include a p-type contact layer 33. The p-type contact layer 33 may be composed of, for example, p-type GaN. In the case where the group-III nitride light-emitting device 11 is an LED, the gallium nitride based semiconductor region 25 is composed of a material for a band gap which does not absorb light from the active layer 15.

If necessary, the group-III nitride light-emitting device 11 may include first and second gallium nitride based semiconductor layers 39$a$ and 39$b$ between the active layer 15 and the gallium nitride based semiconductor region 25. The first gallium nitride based semiconductor layer 39$a$ is disposed between the active layer 15 and the gallium nitride based semiconductor region 25. The first gallium nitride based semiconductor layer 39$a$ is composed of, for example, undoped InGaN and is disposed for guiding light. The second gallium nitride based semiconductor layer 39$b$ is composed of, for example, undoped GaN and is disposed for improving the crystal quality of the gallium nitride based semiconductor region 25.

Figure 1B:
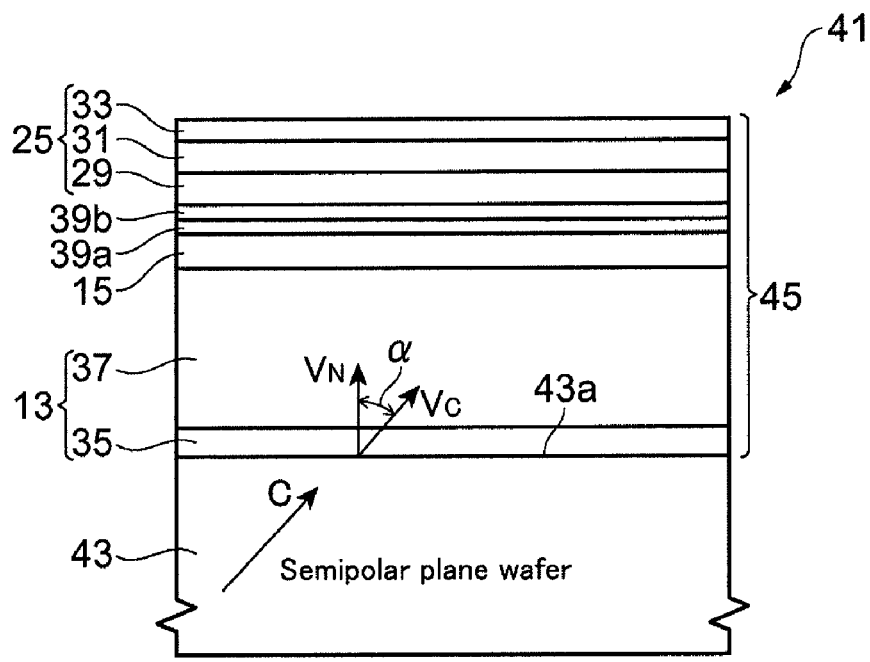
FIG. 1B is a diagram schematically showing an example of the structure of a group-III nitride light-emitting device according to an embodiment.

FIG. 1B shows an epitaxial wafer 41 according to an embodiment. The epitaxial wafer 41 includes a group-III nitride wafer 43 corresponding to the group-III nitride substrate 21 and an epitaxial film 45 grown on a basal plane 43$a$ of the group-III nitride wafer 43. The basal plane 43$a$ thereof may be inclined at an inclination angle within the range of 15 degrees or more, and 85 degrees or less with reference to a {0001} plane or a {000-1} plane, or is inclined preferably at an inclination angle within the range of 15 degrees or more, and 45 degrees or less with reference to the {0001} plane or the {000-1} plane. The group-III nitride wafer 43 may preferably have 45 mm or more of a maximum value of the distance between 2 points on the edge thereof, for example, a 2-inch-size wafer may be used. The epitaxial film 45 may include a layered structure corresponding to the epitaxial growth layer for the group-III nitride light-emitting device 11. Reference numerals of the epitaxial growth layers of the group-III nitride light-emitting device 11 are used for indicating this layered structure.

Vectors C shown in FIG. 1A and FIG. 1B indicate the direction of c-axis of $In_SAl_TGa_{1-S-T}N$ of the group-III nitride substrate 21. Threading dislocations in the group-III nitride substrate 21 extend along a c-axis.

The group-III nitride substrate 21 may include a first region extending along the c-axis from the basal plane 21$a$ to the back surface 21$b$ and a second region extending along the first region. Hence, the first and second regions of the group-III nitride substrate 21 appear in the basal plane 21$a$ and form first and second areas, respectively. Furthermore, the first and second regions of the group-III nitride substrate 21 appear in the back surface 21$b$ and form third and fourth areas, respectively. The first region is a high dislocation region having a threading dislocation density higher than or equal to a predetermined threading dislocation density and the second region is a low dislocation region having a threading dislocation density lower than the predetermined threading dislocation density. In the group-III nitride wafer 43, the first regions and the second regions are arranged alternately. According to this group-III nitride light-emitting device 11, the quantum efficiency and the reliability of the light-emitting device can be improved by producing the nitride based semiconductor light-emitting device in the second region which is a low-dislocation region of the substrate 21. The first regions and the second regions can be extended in the shape of, for example, stripes. In a plane orthogonal to the c-axis, the threading dislocation density of the second region may be, for example, less than $1 \times 10^7$ cm$^{-2}$. According to this threading dislocation density, a laser diode and the like exhibiting practically sufficient reliability are obtained.

Figure 2:
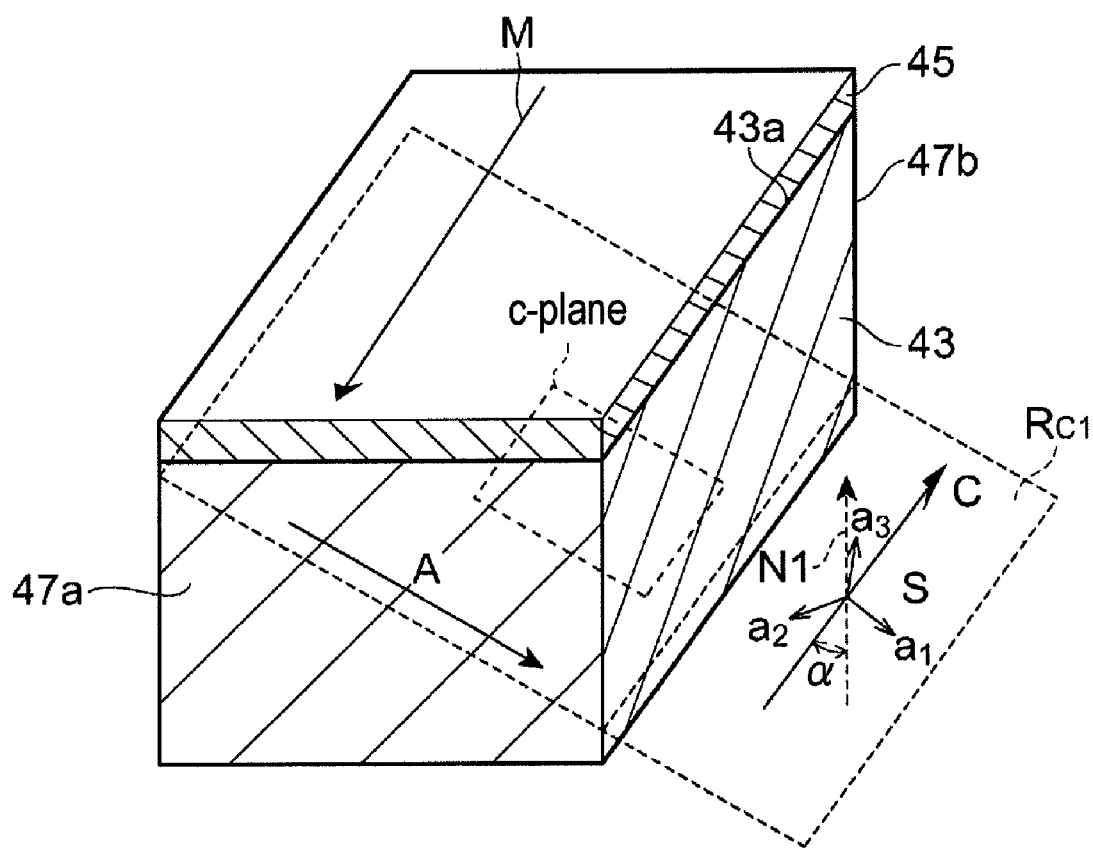
FIG. 2 is a diagram showing an epitaxial wafer including a substrate having a basal plane inclined in a inclination direction shown as an example and an epitaxial film.

FIG. 2 is a diagram showing an epitaxial wafer including a substrate having a basal plane inclined in a inclination direction shown as an example and an epitaxial film. As shown in FIG. 2, a reference plane $R_{C1}$ extends along the inclined c-plane. The crystal axis S of a hexagonal system is shown on the reference plane $R_{C1}$. The axes a1, a2, and a3 are specified in the reference plane $R_{C1}$, and the axes a1, a2, and a3 form an angle of 120 degrees with each other. The axis C is orthogonal to the reference plane $R_{C1}$. An arrow N1 indicated by a broken line is a vector showing a normal to the basal plane 43$a$ of the substrate 43. This normal vector N1 is inclined at an angle of α with reference to the axis C. In this example, the direction of inclination is the direction of the a1-axis indicated by a vector A. That is, the inclination angle α is specified in the direction of the a-axis of $In_SAl_TGa_{1-S-T}N$ of the group-III nitride substrate 21. Preferably, the inclination angle α is within the range of −1 degree or more, and +1 degree or less with reference to the m-axis. Planes 47$a$ and 47$b$ shown in FIG. 2 are m-planes along which cleavage can occurs. In the case where the group-III nitride light-emitting device 11 is produced through cleavage of the substrate composed of $In_SAl_TGa_{1-S-T}N$, the group-III nitride light-emitting device 11 has first and second facets (corresponding to the above-described planes 47$a$ and 47$b$) which intersect the m-axis direction (indicated by the vector M) of $In_SAl_TGa_{1-S-T}N$ of the group-III nitride substrate 21. These first and second facets are suitable for forming a resonator for a laser diode.

Furthermore, in this form, since the basal plane 21$a$ of the group-III nitride substrate 21 composed of $In_SAl_TGa_{1-S-T}N$ is inclined from the {0001} plane or the {000-1} plane in the a-axis direction, incorporation of indium atoms into the InGaN well layer increases as compared with that in the case of inclination in the m-axis direction. Hence, the InGaN well layer can be grown on the plane inclined in the a-axis direction at a growth temperature (for example, 650° C. or higher, and 780° C. or lower) higher than the growth temperature (for example, 650° C. or higher, and 750° C. or lower) on the plane inclined in the m-axis direction. As a result, the emission characteristics can be improved.

As for a modified example of this example, the inclination in the m-axis direction may be employed instead of the inclination in the a-axis direction. At this time as well, the inclination angle α may be within the range of −1 degree or more, and +1 degree or less with reference to the a-axis. According to this group-III nitride light-emitting device, control of the direction in which the inclination angle is specified becomes easy.

Figure 3:
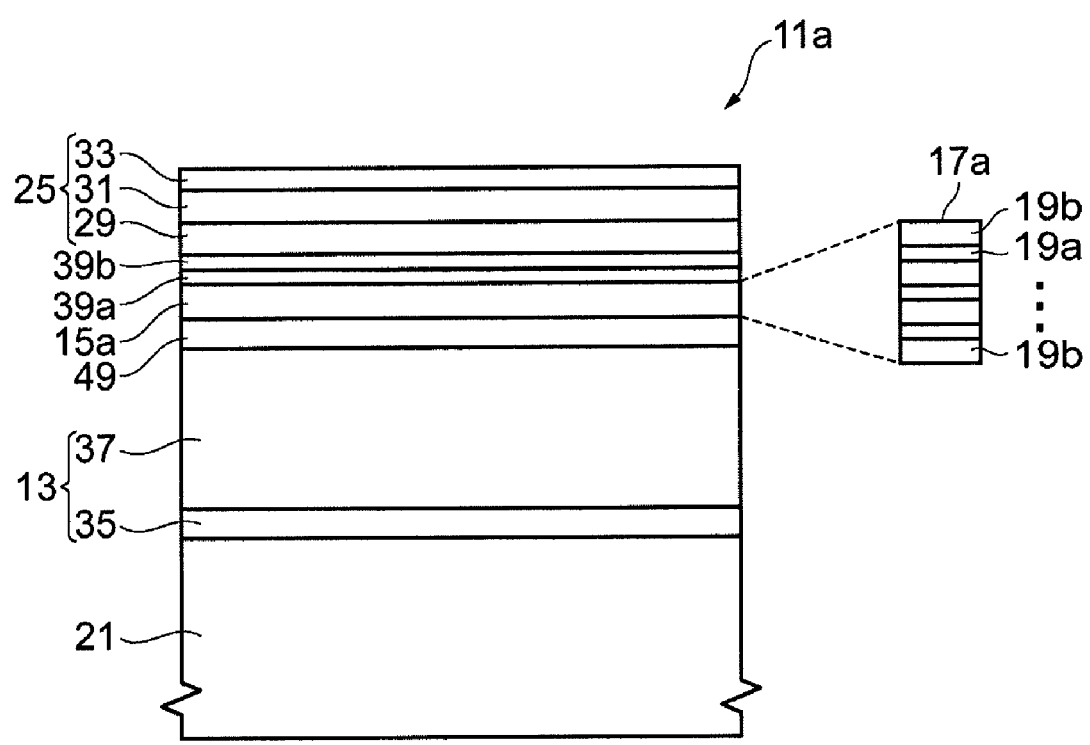
FIG. 3 is a diagram showing another example of the structure of a group-III nitride light-emitting device according to an embodiment.

FIG. 3 shows the structure of a group-III nitride light-emitting device according to another embodiment of the present invention. Preferably, a group-III nitride light-emitting device 11$a$ further includes an $In_ZGa_{1-Z}N$ (0<Z<0.1, where Z is a strained composition) layer 49 between an active layer 15$a$ and the group-III nitride substrate 21. The indium composition of the $In_ZGa_{1-Z}N$ layer 49 is smaller than the indium composition of a well layer 19a. According to this group-III nitride light-emitting device 11a, the $In_ZGa_{1-Z}N$ layer 49 is disposed between a quantum well structure 17a and an n-type gallium nitride based semiconductor region 13. A basal plane of the $In_ZGa_{1-Z}N$ layer 49 is a semipolar plane. The emission intensity can be enhanced by increasing the number of the well layers in the quantum well structure. However, since the indium composition of the well layer 19a in the active layer produced on the semipolar plane is higher than that of the active layer produced on a c-plane, strain in the active layer is significant. Consequently, the crystal quality of the InGaN well layer 19a tends to degrade as compared with the active layer produced on the c-plane. The number of well layers 19a in the quantum well structure 17a is smaller than the number of well layers 19a in the quantum well structure 17. However, the $In_ZGa_{1-Z}N$ layer 49 reduces the strain in the quantum well structure 17a and provides good emission characteristics. Therefore, the number of well layers 19a in the quantum well structure 17a can be reduced. Alternatively, the crystal quality can be improved while the number of well layers is maintained.

If the indium composition of the $In_ZGa_{1-Z}N$ layer 49 becomes 0.1 or more, the strain of the $In_ZGa_{1-Z}N$ layer increases, the crystal quality of the InGaN well layer is degraded, and the emission characteristics tend to deteriorate.

Example 1

Figure 4:
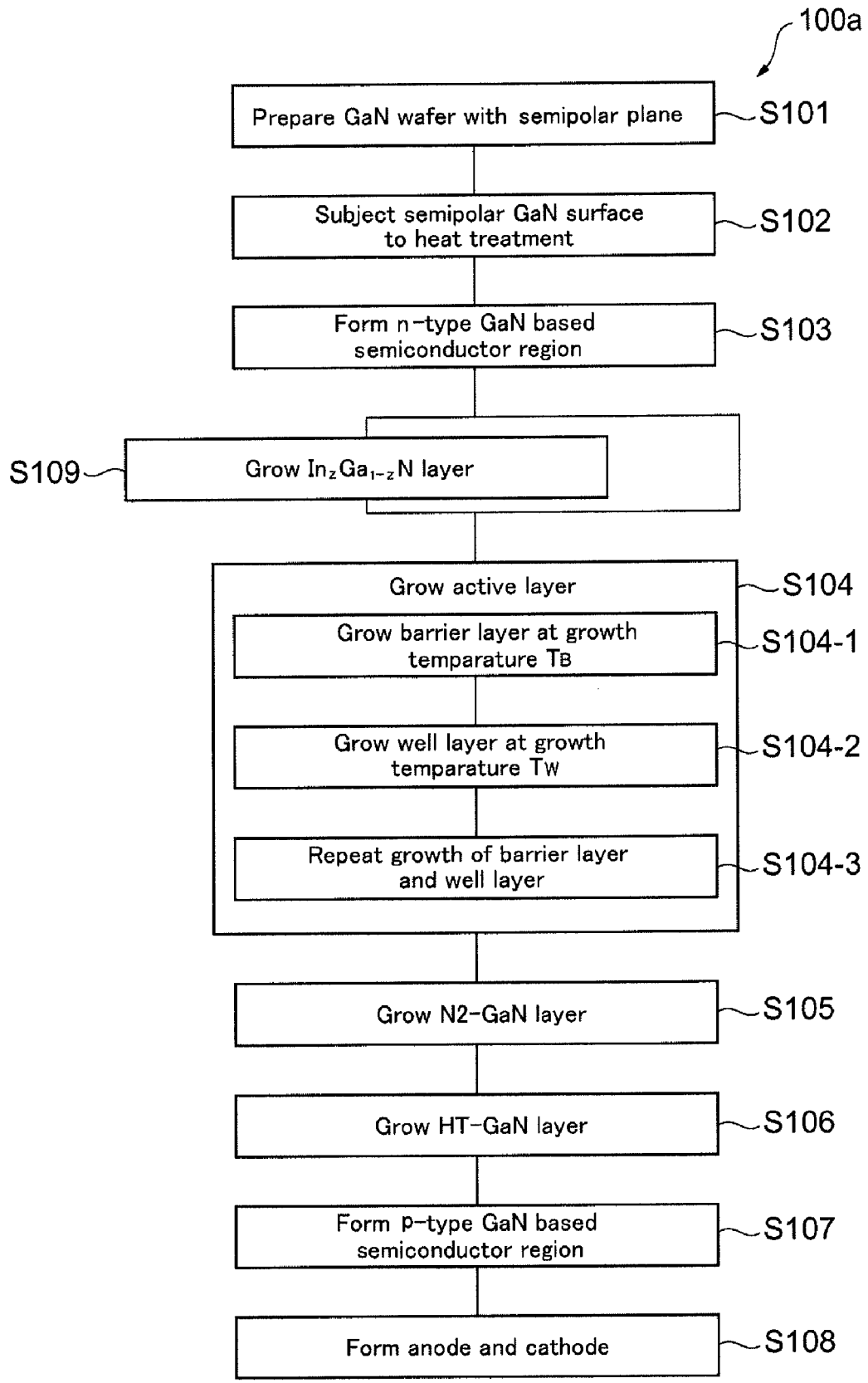
FIG. 4 is a diagram showing key steps for producing a light-emitting device.

A flow 100a of key steps for producing a light-emitting device will be described with reference to FIG. 4. In Step S101, a GaN wafer was prepared. The resulting GaN wafer exhibited n-type conductivity and had a basal plane inclined at an inclination angle of 25 degrees from a c-plane in the direction of an m-axis. The GaN wafer was produced as described below. A 2-inch-size GaAs wafer was prepared. A stripe-shaped insulating mask composed of a silicon oxide was formed on the GaAs wafer having a (111) plane which was 25 degrees off in a (100) direction. Thereafter, a GaN thick film was grown on the resulting wafer by an HVPE method. The GaN thick film included low-defect-density regions and high-defect-density regions arranged alternately. Each of the low-defect-density regions and high-defect-density regions took on the shape of a stripe. Threading dislocation in the low-defect-density region extended in the direction of the c-axis, and the threading dislocation density thereof was less than $1\times10^6$ $cm^{-2}$ in the c-plane. This GaN thick film was sliced to form a GaN thin sheet. In addition, the surface of this thin sheet was subjected to a treatment, e.g., polishing, so as to produce a GaN wafer having a mirror finished surface. The resulting GaN wafer had a basal plane inclined at an inclination angle of 25 degrees from the c-plane in the direction of the m-axis.

A blue light-emitting device was produced on the GaN wafer by an organic metal chemical vapor deposition method on the basis of the procedure described below. As for source materials for the organic metal chemical vapor deposition, trimethylgallium, trimethylaluminum, trimethylindium, ammonia, monosilane, and cyclopentadienylmagnesium were used. In Step S102, the GaN wafer was placed on a susceptor in a growth reactor, ammonia and hydrogen were introduced into the reactor while the pressure in the reactor was controlled at 30 kPa, and thermal cleaning was conducted at a substrate temperature of 1,050° C. for 10 minutes. Thereafter, the growth was suspended once, and the substrate temperature was raised to 1,100° C. In Step S103, an n-type GaN based semiconductor region was grown. Hydrogen was served as a primary carrier gas, and trimethylgallium (24 μmol/min), trimethylaluminum (4.3 μmol/min), ammonia (0.22 mol/min), and monosilane were fed to the growth reactor, so that an n-type $Al_{0.12}Ga_{0.88}N$ layer having a film thickness of 50 nm was grown. Subsequently, the growth was suspended once, and the substrate temperature was raised to 1,150° C. Hydrogen was served as a primary carrier gas, and trimethylgallium (244 μmol/min), ammonia (0.22 mol/min), and monosilane were fed to the growth reactor, so that an n-type GaN layer having a film thickness of 2 μm was grown.

In Step S104, an active layer was grown as described below. The growth was suspended once, and the substrate temperature was lowered to 850° C. Thereafter, nitrogen was served as a primary carrier gas, and trimethylgallium (24 μmol/min), trimethylindium (1.6 μmol/min), and ammonia (0.27 mol/min) were fed to the growth reactor, so that an undoped $In_{0.01}Ga_{0.99}N$ barrier layer having a film thickness of 15 nm was grown. Subsequently, the growth was suspended, and the substrate temperature was lowered to 720° C. In Step S104-2, nitrogen was served as a primary carrier gas, and trimethylgallium (24 μmol/min), trimethylindium (24 μmol/min), and ammonia (0.36 mol/min) were fed to the growth reactor, so that an $In_{0.30}Ga_{0.70}N$ well layer having a film thickness of 5 nm was grown. In Step S104-3, these Step S104-1 and Step S104-2 were repeated and, thereby, a quantum well structure including, for example, 6 well layers was formed.

Preferably, the temperature $T_W$ suitable for growth of the well layer is lower than the temperature $T_B$ suitable for growth of the barrier layer, and the difference between the temperature $T_W$ and the temperature $T_B$ is 95 degree or more in Celsius. Regarding this method, in the production of the nitride based semiconductor light-emitting device on the semipolar plane, the growth temperature $T_W$ of the InGaN well layer is made lower than the growth temperature $T_B$ of the barrier layer in such a way that the difference becomes 95 degree or more in Celsius and, thereby, incorporation of indium atoms can increase in the growth of the well layer. Consequently, a light-emitting layer having an emission peak wavelength of 410 nm or more can be formed. Furthermore, the growth temperature of the barrier layer is made higher than the growth temperature of the well layer in such a way that the difference becomes 95 degree in Celsius or more and, thereby, the crystal quality of the barrier layer can be improved. Hence, the quantum efficiency of the light-emitting device can be improved. Therefore, the crystal quality of the whole quantum well structure can be improved. If the growth temperature of the barrier layer is too low, the crystal quality of the barrier layer is degraded. Therefore, it is preferable that the temperature $T_B$ is 745° C. or higher. If the growth temperature of the barrier layer is too high, the crystal quality of the well layer is degraded during growth of the barrier layer. Therefore, it is preferable that the temperature $T_B$ is 900° C. or lower. Furthermore, if the growth temperature of the well layer is too low, the crystal quality of the well layer deteriorates. Therefore, it is preferable that the temperature $T_W$ is 650° C. or higher. If the growth temperature of the well layer is too high, the inclusion of indium is reduced. Therefore, it is preferable that the temperature $T_W$ is 805° C. or lower. If necessary, in Step S105, nitrogen may be served as a primary carrier gas and an undoped GaN layer (N2-GaN) may be grown at the temperature $T_B$. This is conducted to prevent degradation of quality of the active layer in the downstream step of raising the substrate temperature while the film thickness is 3 nm, for example. If necessary, in Step S106, hydrogen may be served as a primary carrier gas and an undoped GaN layer (HT-GaN) may be grown at a temperature higher than the temperature $T_B$. This is conducted to improve the crystal quality of the p-type GaN semiconductor grown in the downstream step while the film thickness is 10 nm, for example.

Next, the growth was suspended again, and the substrate temperature was raised to 1,050° C. In Step S107, a p-type GaN based semiconductor region was grown. Hydrogen was served as a primary carrier gas, and trimethylgallium (24 μmol/min), trimethylaluminum (2.3 μmol/min), ammonia (0.22 mol/min), and cyclopentadienylmagnesium were fed to the growth reactor, so that a p-type $Al_{0.15}Ga_{0.85}N$ electron blocking layer having a film thickness of 20 nm was grown. Thereafter, hydrogen was served as a primary carrier gas, and trimethylgallium (99 μmol/min), ammonia (0.22 mol/min), and cyclopentadienylmagnesium were fed to the growth reactor, so that a p-type GaN layer having a film thickness of 25 nm was grown. Subsequently, hydrogen was served as a primary carrier gas, and trimethylgallium (67 μmol/min), ammonia (0.22 mol/min), and cyclopentadienylmagnesium were fed, so that a p-type GaN contact layer having a film thickness of 25 nm was grown. In this manner, an epitaxial wafer having an LED epitaxial structure was produced.

The resulting epitaxial wafer was taken out of the reactor. In Step S108, a translucent p-side electrode (electrode area: $1.6 \times 10^{-3}$ cm$^2$) 400 μm square was formed on the p-type GaN layer of the epitaxial wafer and, in addition, an n-side electrode was formed on the back surface of the GaN wafer so as to produce a substrate product. The resulting substrate product included arrayed LED devices.

Electric characteristics of the LED device were measured while the thus produced substrate product was on an "as-is" basis. When a pulsed current was applied at room temperature, pure blue light with a peak wavelength of 466 nm was emitted. The optical output was 1.0 mW and the external quantum efficiency was 1.6% at a current value of 20 mA (current density: 12.5 A/cm$^2$). The optical output was 7.0 mW and the external quantum efficiency was 1.2% at a current value of 200 mA (current density: 125 A/cm$^2$). An LED chip was produced from the substrate product, and the chip was molded with an epoxy resin so as to produce an LED lamp. Regarding the resulting LED lamp, the peak emission wavelength was 466 nm, the optical output was 3.0 mW, and the external quantum efficiency was 4.8% at a current value of 20 mA (current density: 12.5 A/cm$^2$).

In a manner similar to the above-described manufacturing method, an LED structure was produced on a GaN wafer having a semipolar plane inclined at an inclination angle of 32 degrees and, in addition, electrodes were formed.

Figure 5A:
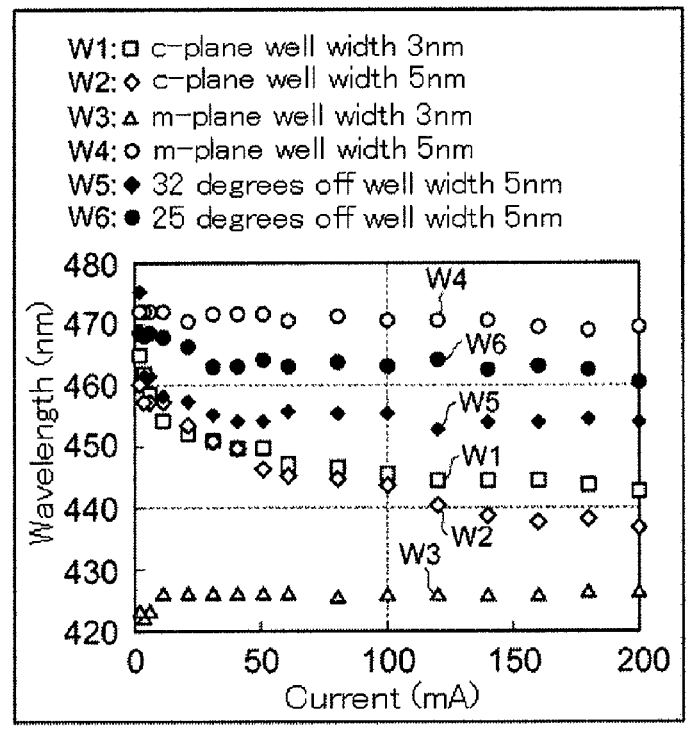
FIG. 5A is a diagram showing the relationship between the emission wavelength and the current of LED in an embodiment.
Figure 5B:
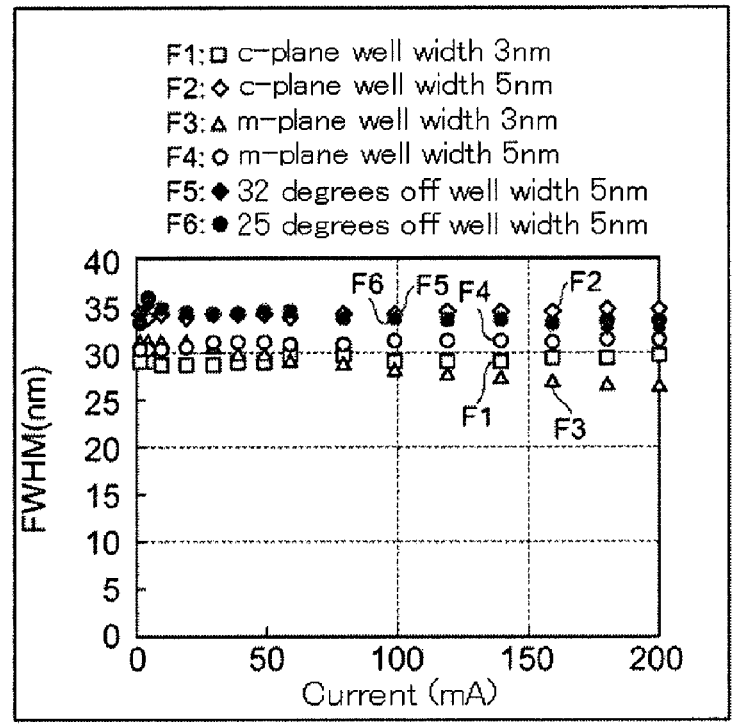
FIG. 5B is a diagram showing the relationship between the full width half maximum of an emission spectrum and the current in an embodiment.

FIG. 5A is a diagram showing the relationship between the emission wavelength and the current of the LED in the present example. FIG. 5B is a diagram showing the relationship between the full width half maximum of an emission spectrum and the current in the present example. The thickness of the well layer of the light-emitting device on the semipolar plane was 5 nm.

As shown in FIG. 5A, the blue shift of the light-emitting device on the semipolar plane in the present example is small as compared with that of the light-emitting device on the c-plane of the polar plane, although not small to the extent equal to that of the light-emitting device on the m-plane of the nonpolar plane. In the present example, since the piezoelectric field is suppressed on the semipolar plane, the blue shift of emission wavelength caused by screening of the piezoelectric field along with an increase in current is reduced.

As shown in FIG. 5B, the full width half maximum of the light-emitting device on the semipolar plane in the present example is small at the same level as those of the light-emitting device on the m-plane of the nonpolar plane and the light-emitting device on the c-plane of the polar plane. Consequently, it is clear that the active layer quality at the same level as those on the m-plane and the c-plane is obtained on the semipolar plane.

Example 2

Key steps for producing the light-emitting device will be described again with reference to FIG. 4. In the manufacturing method of the present example, Step S109 is conducted after Step S103 prior to Step S104.

In Step S109, an $In_{0.02}Ga_{0.98}N$ layer was grown on the n-type GaN layer. In Step S104, the quantum well structure including 3 well layers was formed on the $In_{0.02}Ga_{0.98}N$ layer. The well layer and the barrier layer of the active layer had the thicknesses of 5 nm and 15 nm, respectively. Subsequently, a p-type GaN based semiconductor region was grown by using the same steps as in Example 1, so that an epitaxial wafer including an LED epitaxial structure was produced.

The resulting epitaxial wafer was taken out of the reactor. In Step S108, a translucent p-side electrode 400 μm square was formed on the p-type GaN layer of the epitaxial wafer and, in addition, an n-side electrode was formed on the back surface of the GaN wafer so as to produce a substrate product. The resulting substrate product included arrayed LED devices.

Electric characteristics of the LED device were measured while the thus produced substrate product was on an "as-is" basis. When a pulsed current was applied at room temperature, pure blue light with a peak wavelength of 466 nm was emitted. The optical output was 2.0 mW and the external quantum efficiency was 3.2% at a current value of 20 mA (current density: 12.5 A/cm$^2$). The optical output was 14.0 mW and the external quantum efficiency was 2.4% at a current value of 200 mA (current density: 125 A/cm$^2$). An LED chip was produced from the substrate product, and the chip was molded with an epoxy resin so as to produce an LED lamp. Regarding the resulting LED lamp, the peak emission wavelength was 466 nm, the optical output was 6.0 mW, and the external quantum efficiency was 9.6% at a current value of 20 mA (current density: 12.5 A/cm$^2$).

Example 3

Figure 6:
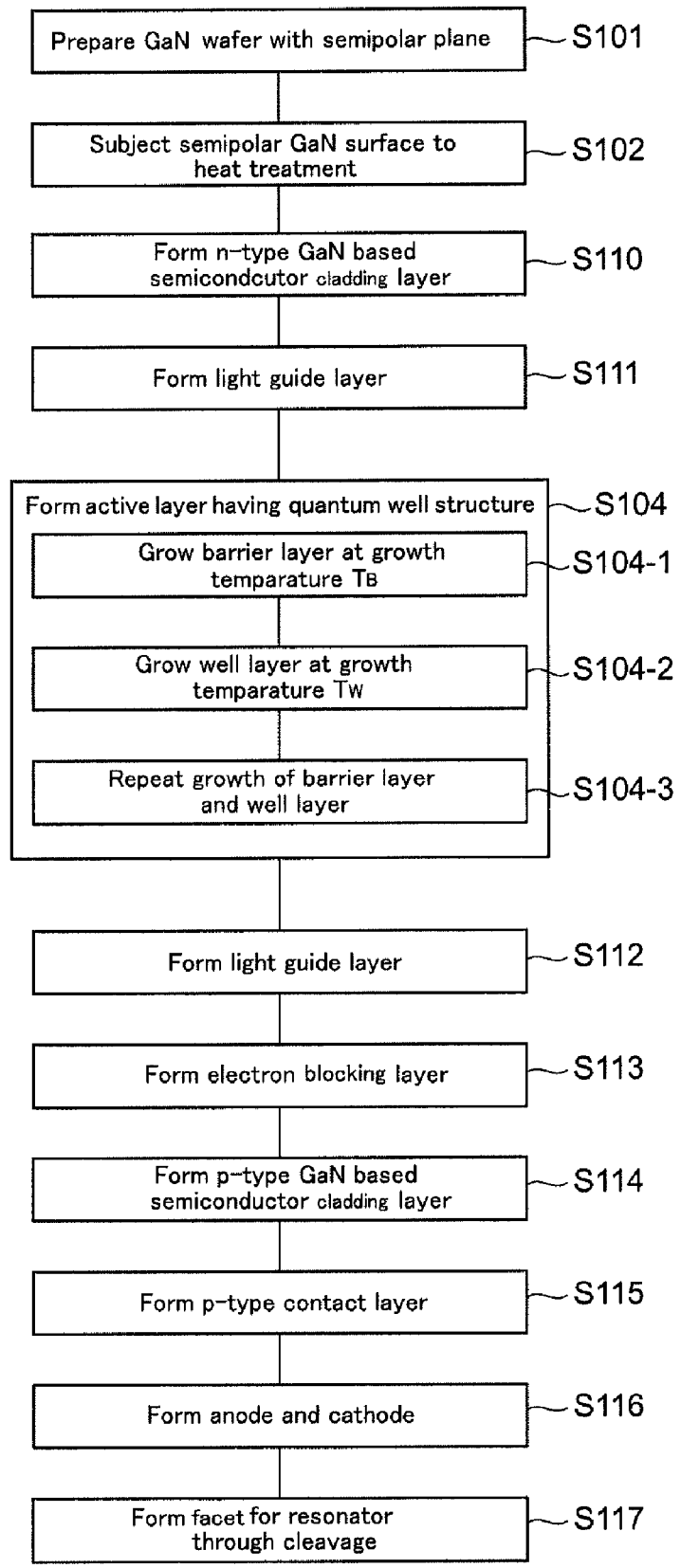
FIG. 6 is a diagram showing key steps for producing a laser diode device.

Key step for producing a laser diode device will be described with reference to FIG. 6. A GaN wafer produced as in Example 1 was prepared. The resulting GaN wafer had a basal plane inclined at an inclination angle of 25 degrees from a c-plane in the direction of an a-axis. The GaN wafer included low-defect-density regions and high-defect-density regions arranged alternately. Each of the low-defect-density regions and high-defect-density regions took on the shape of a stripe. Threading dislocations in the low-defect-density region extended in the direction of the c-axis, and the threading dislocation density thereof was less than $1 \times 10^6$ cm$^{-2}$ in the c-plane. A laser diode device was produced on the GaN wafer by an organic metal chemical vapor deposition method on the basis of the procedure described below. In Step S102, the GaN wafer was placed on a susceptor in a growth reactor, was suspended once, and the substrate temperature was changed to 870° C. Thereafter, nitrogen was served as a primary carrier gas, and trimethylgallium (24 μmol/min), trimethylindium (1.6 μmol/min), and ammonia (0.27 mol/min) were fed to the growth reactor, so that an undoped $In_{0.05}Ga_{0.95}N$ barrier layer having a film thickness of 15 nm was grown. Subsequently, in Step S104-2, the growth was suspended, and the substrate temperature was lowered to 720° C. Thereafter, nitrogen was served as a primary carrier gas, and trimethylgallium (24 µmol/min), trimethylindium (24 µmol/min), and ammonia (0.36 mol/min) were fed to the growth reactor, so that an $In_{0.30}Ga_{0.70}N$ well layer having a film thickness of 5 nm was grown. In Step S104-3, these Steps were repeated and, thereby, a quantum well structure including 3 well layers was formed. The efficiency of incorporation of indium into the InGaN film can be increased by specifying nitrogen as the primary carrier gas.

Preferably, the temperature $T_W$ suitable for growth of the well layer is lower than the temperature $T_B$ suitable for growth of the barrier layer, and the difference between the temperature $T_W$ and the temperature $T_B$ is 95 degree or more in Celsius. Regarding this method, in the production of the nitride based semiconductor light-emitting device on the semipolar plane, the growth temperature $T_W$ of the InGaN well layer is made lower than the growth temperature $T_B$ of the barrier layer in such a way that the difference becomes 95 degree or more in Celsius and, thereby, incorporation of indium atoms can increase in the growth of the well layer. Consequently, a light-emitting layer ammonia and hydrogen was introduced into the reactor while the pressure in the reactor was controlled at 30 kPa, and thermal cleaning was conducted at a substrate temperature of 1,050° C. for 10 minutes.

Thereafter, the growth was suspended once, and the substrate temperature was raised to 1,100° C. Subsequently, in Step S110, an n-type GaN based semiconductor cladding layer was grown. Hydrogen was served as a primary carrier gas, and trimethylgallium (118 µmol/min), trimethylaluminum (5.7 µmol/min), ammonia (0.27 mol/min), and monosilane were fed to the growth reactor, so that an n-type $Al_{0.04}Ga_{0.96}N$ layer having a film thickness of 2,300 nm was grown.

In Step S111, a GaN based semiconductor light guide layer was grown. A basal plane of the resulting light guide layer was a semipolar plane. The growth was suspended once, hydrogen was served as a primary carrier gas, and trimethylgallium (99 µmol/min), ammonia (0.22 mol/min), and monosilane were fed to the growth reactor while the substrate temperature was kept at 1,100° C., so that an n-type GaN light guide layer having a film thickness of 50 nm was grown. Subsequently, the growth was suspended once, and the substrate temperature was changed to 800° C. Thereafter, hydrogen was served as a primary carrier gas, and trimethylgallium (16 µmol/min), trimethylindium (0.87 µmol/min), and ammonia (0.36 mol/min) were fed to the growth reactor, so that an undoped $In_{0.02}Ga_{0.98}N$ light guide layer having a film thickness of 50 nm was grown.

In Step S104, an active layer was grown. In Step S104-1, the growth having an emission peak wavelength of 410 nm or more can be formed. Furthermore, the growth temperature of the barrier layer is made higher than the growth temperature of the well layer in such a way that the difference becomes 95 degree or more in Celsius and, thereby, the crystal quality of the barrier layer can be improved. Hence, the quantum efficiency of the light-emitting device can be improved. Therefore, the crystal quality of the whole quantum well structure can be improved.

Next, the growth was suspended again, and the substrate temperature was changed to 800° C. Thereafter, in Step S112, a GaN based semiconductor light guide layer was grown. A basal plane of the resulting light guide layer was a semipolar plane. Hydrogen was served as a primary carrier gas, and trimethylgallium (15.6 µmol/min), trimethylindium (0.87 µmol/min), and ammonia (0.36 mol/min) were fed to the growth reactor, so that an undoped $In_{0.02}Ga_{0.98}N$ light guide layer having a film thickness of 50 nm was grown. Subsequently, the growth was suspended once, and the substrate temperature was changed to 1,050° C. Hydrogen was served as a primary carrier gas, and trimethylgallium (99 µmol/min) and ammonia (0.22 mol/min) were fed to the growth reactor, so that an undoped GaN light guide layer having a film thickness of 50 nm was grown.

In Step S113, the growth was suspended again, and an electron blocking layer was grown while the substrate temperature was kept at 1,050° C. Hydrogen was served as a primary carrier gas, and trimethylgallium (24 µmol/min), trimethylaluminum (2.3 µmol/min), ammonia (0.22 mol/min), and cyclopentadienylmagnesium were fed to the growth reactor, so that a p-type $Al_{0.15}Ga_{0.85}N$ electron blocking layer having a film thickness of 20 nm was grown.

Subsequently, in Step S114, a p-type cladding layer was grown. The surface of the p-type cladding layer was a semipolar plane. Hydrogen was served as a primary carrier gas, and trimethylgallium (49 µmol/min), trimethylaluminum (4.0 µmol/min), ammonia (0.27 mol/min), and cyclopentadienylmagnesium were fed to the growth reactor, so that a p-type $Al_{0.07}Ga_{0.93}N$ cladding layer having a film thickness of 400 nm was grown.

Then, in Step S115, a p-type contact layer was grown. The surface of the p-type contact layer was a semipolar plane. Hydrogen was served as a primary carrier gas, and trimethylgallium (34 µmol/min), ammonia (0.22 mol/min), and cyclopentadienylmagnesium were introduced, so that a p-type GaN layer having a film thickness of 50 nm was grown.

Figure 7:
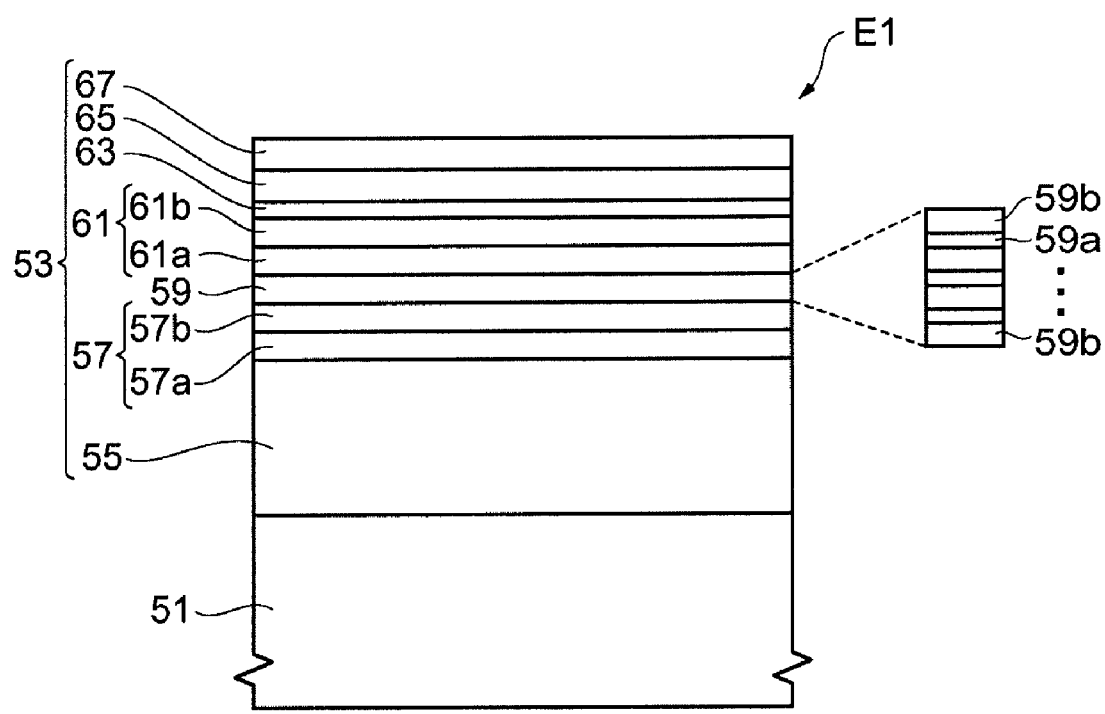
FIG. 7 is a diagram showing an epitaxial wafer of a laser diode device.

In this manner, an epitaxial wafer E1 including a laser diode epitaxial structure was produced. FIG. 7 is a diagram showing the structure of an epitaxial wafer for a laser diode device. The epitaxial wafer E1 included an epitaxial multilayer film 53, described below, grown on a GaN wafer 51 which is a semipolar plane. The epitaxial multilayer film 53 includes an n-type cladding layer 55, an n-side light guide layer 57 (n-type GaN layer 57a, undoped InGaN layer 57b), an active layer 59 (InGaN well layers 59a, InGaN barrier layers 59b), a p-side light guide layer 61 (undoped InGaN layer 61a, undoped InGaN layer 61b), an electron blocking layer 63, a p-type cladding layer 65, and a p-type contact layer 67.

After the p-type contact layer was covered with an insulating film, e.g., a silicon oxide film, a stripe-shaped window was formed in the insulating film. A p-side electrode (for example, Ni/Au) was formed on the p-type contact layer and the insulating film and, in addition, the thickness of the GaN wafer was reduced. Thereafter, an n-side electrode (for example, Ti/Al/Au) was formed on the back surface of the wafer having the reduced thickness so as to produce a substrate product. The resulting substrate product included arrayed laser diode devices. In Step S117, a laser bar was formed from this substrate product through cleavage so as to form a facet mirror for a resonator. The length of the laser bar was, for example, 800 µm. Electric characteristics of the thus produced laser bar were measured. When a pulsed current was applied at room temperature, greenish-blue lasing with a peak wavelength of 490 nm occurred.

Figure 8:
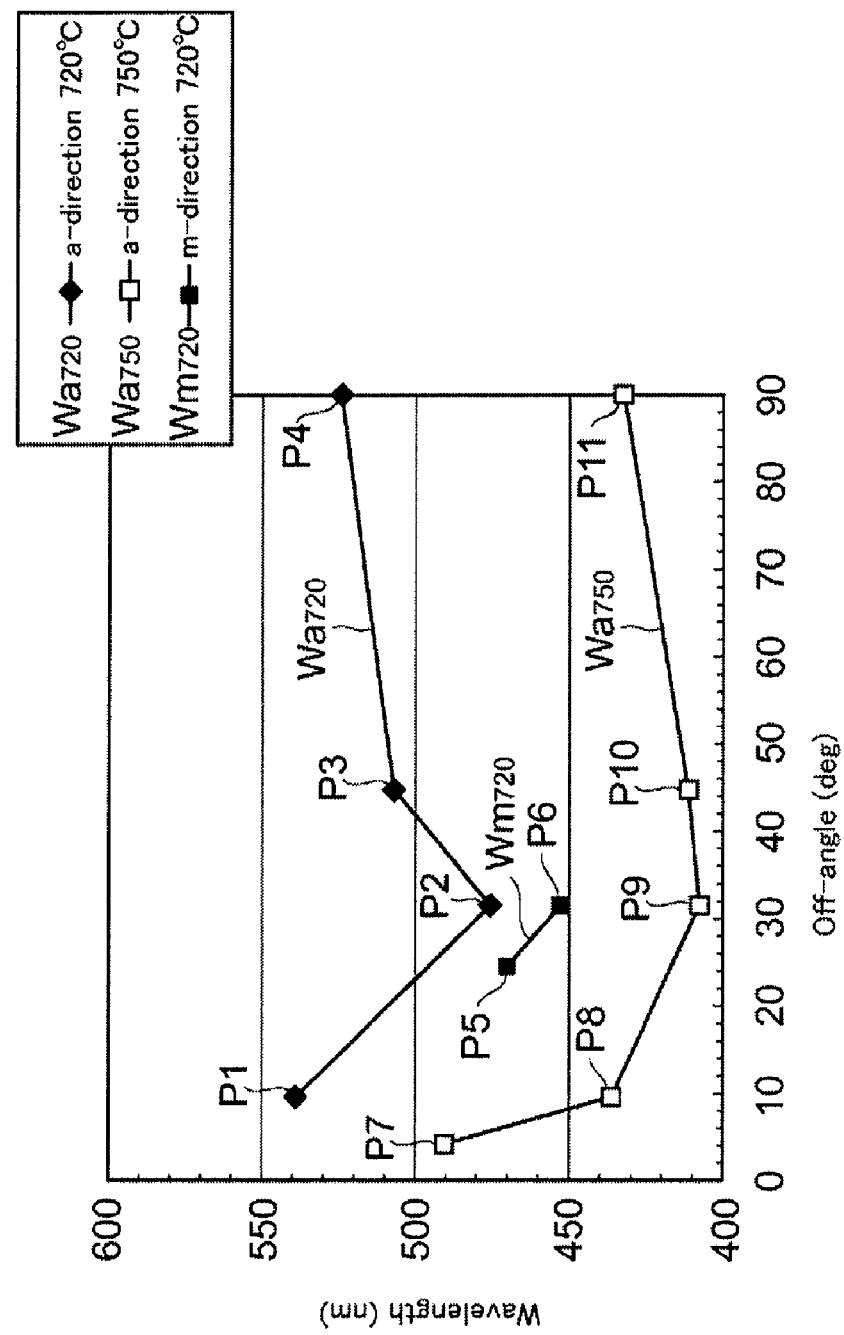
FIG. 8 is a diagram showing the relationship between the inclination angle of wafer basal plane and the peak emission wavelength.

The following are further shown on the basis of various experiments conducted by the present inventors. FIG. 8 is a diagram showing the relationship between the inclination angle of a wafer basal plane and the peak emission wavelength regarding a wafer basal plane. The light-emitting devices indicated by measurement points P1 to P4 are produced on wafer basal planes inclined in the a-axis direction, and the growth temperature of the InGaN well layer is 720° C. The light-emitting devices indicated by measurement points P5 and P6 are produced on wafer basal planes inclined in the m-axis direction, and the growth temperature of the InGaN well layer is 720° C. The light-emitting devices indicated by measurement points P7 to P11 are produced on wafer basal planes inclined in the a-axis direction, and the growth temperature of the InGaN well layer is 750° C.

As is shown by the characteristic lines $W_{a720}$ and the $W_{a750}$, the peak emission wavelength is shifted to the long wavelength side as the growth temperature of the well layer is lowered. Therefore, an amount of incorporation of indium is increased by lowering the growth temperature of the well layer.

As is shown by the characteristic lines $W_{a720}$ and the $W_{m720}$, the peak emission wavelength is shifted to the long wavelength side because of inclination in the a-axis direction. A longer emission wavelength can be obtained by increasing the inclination angle in the a-axis direction as compared with the inclination angle in the m-axis direction. Specific data are as described below.

| Measurement point | Inclination angle | emission wavelength |
|---|---|---|
| P1: | 10 | 539 |
| P2: | 32 | 474 |
| P3: | 45 | 506 |
| P4: | 90 | 524 |
| P5: | 25 | 469 |
| P6: | 32 | 452 |
| P7: | 5 | 490 |
| P8: | 10 | 435 |
| P9: | 32 | 407 |
| P10: | 45 | 410 |
| P11: | 90 | 431 |

The inclination angle is expressed in the unit of "degree (deg)", and the emission wavelength is expressed in the unit "nm".

The peak emission wavelength of the light-emitting device on the GaN wafer basal plane having an inclination angle of 15 degrees or more, and less than 45 degrees is smaller than that of the light-emitting device on the GaN wafer basal plane having an inclination angle of less than 15 degrees. Consequently, it is believed that the influence of the piezoelectric field on the light-emitting device on the GaN wafer basal plane having an inclination angle of 20 degrees or more, and less than 45 degrees is reduced.

Furthermore, in the case where the InGaN well layers are grown at the same temperature, the peak emission wavelength of the light-emitting device on the GaN wafer in which the basal plane is inclined in the a-axis direction is larger than the peak emission wavelength of the light-emitting device on the GaN wafer in which the basal plane is inclined in the m-axis direction. It is believed that the incorporation of indium in the growth of the well layer is facilitated on the basis of the extent of inclination in the a-axis direction.

The crystal quality can be improved and the quantum efficiency and the reliability of the light-emitting device can be improved by producing the light-emitting device on the group-III nitride wafer, in particular in the low-dislocation-density region.

The indium composition of the well layer of the light-emitting device, which is on the semipolar plane, with an emission wavelength of 410 nm or more is very high as compared with that of the light-emitting device with an emission wavelength of less than 410 nm. However, the indium composition of the well layer can be made within the range of 0.15 or more, and 0.4 or less by specifying the thickness of the well layer to be within the range of 4 nm or more, and 10 nm or less, so that deterioration of the emission characteristics along with degradation of the crystal quality of the well layer can be suppressed.

The principle of the present invention has been described with reference to drawings on the basis of preferred embodiments. However, in the present invention, the arrangement and the like can be changed within the bounds of the above-described principle. The present invention is not limited to the specific configurations disclosed in the present embodiments. Therefore, the present invention covers various changes and modifications included within the scope of the appended claims.

What is claimed is:

1. A group-III nitride light-emitting device comprising:
   a group-III nitride substrate;
   a gallium nitride based semiconductor region grown on the group-III nitride substrate;
   an active layer grown on a basal plane of the gallium nitride based semiconductor region in such a way as to have an emission peak wavelength of 410 nm or more,
   wherein the active layer includes a quantum well structure in which well layers and barrier layers are arranged alternately,
   the thickness of the well layer is 4 nm or more, and 10 nm or less,
   the well layer is composed of $In_XGa_{1-X}N$ ($0.15 \leq X < 1$, where X is a strained composition),
   the barrier layer is composed of $In_YGa_{1-Y}N$ ($0 \leq Y \leq 0.05$, $Y<X$, where Y is a strained composition), and
   the basal plane is a semipolar plane inclined at an inclination angle within the range of 15 degrees or more, and 85 degrees or less with reference to a {0001} plane or a {000-1} plane;
   a p-type gallium nitride based semiconductor region grown on the active layer; and
   a first electrode disposed on the p-type gallium nitride based semiconductor region,
   wherein the gallium nitride based semiconductor region grown on the group-III nitride substrate has n-type conductivity,
   the basal plane of the group-III nitride substrate is inclined at an inclination angle within the range of 15 degrees or more, and 85 degrees or less with reference to the {0001} plane or the {000-1} plane,
   the gallium nitride based semiconductor region, the active layer, and the p-type gallium nitride based semiconductor region are located on the basal plane of the group-III nitride substrate in that order from the group-III nitride substrate, and
   the group-III nitride substrate is composed of $In_SAl_TGa_{1-S-T}N$ ($0 \leq S \leq 1$, $0 \leq T \leq 1$, and $0 \leq S+T \leq 1$).

2. The group-III nitride light-emitting device according to claim 1, wherein the basal plane is inclined at an angle within the range of 15 degrees or more, and 45 degrees or less with reference to the {0001} plane or the {000-1} plane.

3. The group-III nitride light-emitting device according to claim 1, wherein the basal plane is inclined at an angle within the range of 15 degrees or more, and 45 degrees or less with reference to the {0001} plane or the {000-1} plane, and the indium composition X of the well layer is less than 0.4 ($0.15 \leq X < 0.4$).

4. The group-III nitride light-emitting device according to claim 1, wherein the quantum well structure of the active layer is grown on the basal plane in such a way as to have an emission peak wavelength of 550 nm or less.

5. The group-III nitride light-emitting device according to claim 1, further comprising a second electrode disposed on a back surface of the group-III nitride substrate, wherein the group-III nitride substrate has n-type conductivity.

6. The group-III nitride light-emitting device according to claim 1, wherein the basal plane of the group-III nitride substrate is inclined at an inclination angle within the range of 15 degrees or more, and 85 degrees or less with reference to the {0001} plane or the {000-1} plane, the inclination angle is specified in an a-axis direction of $In_SAl_TGa_{1-S-T}N$ of the group-III nitride substrate, and the off-angle of the inclination angle is within the range of −1 degree or more, and +1 degree or less with reference to an m-axis.

7. The group-III nitride light-emitting device according to claim 1, wherein the group-III nitride substrate further comprises a first facet and a second facet which intersect the m-axis direction of $In_SAl_TGa_{1-S-T}N$, the group-III nitride light-emitting device includes a laser diode, and the first and second facet include cleavage planes.

8. The group-III nitride light-emitting device according to claim 1, wherein the basal plane of the group-III nitride substrate is inclined at an inclination angle within the range of 15 degrees or more, and 85 degrees or less with reference to the {0001} plane or the {000-1} plane, the inclination angle is specified in an m-axis direction of $In_SAl_TGa_{1-S-T}N$ of the group-III nitride substrate, and the off-angle of the inclination angle is within the range of −1 degree or more, and +1 degree or less with reference to an a-axis.

9. The group-III nitride light-emitting device according to claim 1, further comprising $In_ZGa_{1-Z}N$ (0<z<0.1, where Z is a strained composition) layer between the active layer and the group-III nitride substrate.

10. The group-III nitride light-emitting device according to claim 1, wherein threading dislocations in the group-III nitride substrate extend along a c-axis, the group-III nitride substrate includes a first region having a threading dislocation density higher than or equal to a predetermined threading dislocation density and a second region having a threading dislocation density lower than the predetermined threading dislocation density, and the first and second regions of the group-III nitride substrate appear in the basal plane.

11. The group-III nitride light-emitting device according to claim 10, wherein the threading dislocation density of the second region is less than $1 \times 10^7$ cm$^{-2}$.

* * * * *